United States Patent [19]
Ohninata

[11] 4,188,548
[45] Feb. 12, 1980

[54] SEMICONDUCTOR SWITCHING CIRCUIT
[75] Inventor: Ichiro Ohninata, Yokohama, Japan
[73] Assignee: Hitachi, Ltd., Japan
[21] Appl. No.: 845,722
[22] Filed: Oct. 26, 1977
[30] Foreign Application Priority Data
Oct. 29, 1976 [JP] Japan .................................. 51-129529
[51] Int. Cl.² ............................................. H03K 17/72
[52] U.S. Cl. ................................................. 307/252 C
[58] Field of Search .............. 307/252 C, 252 G, 305, 307/238, 299 B; 179/18 FA
[56] References Cited
U.S. PATENT DOCUMENTS
3,821,565  6/1974  Horinaga .......................... 307/252 C Primary Examiner—John Zazworsky
Attorney, Agent, or Firm—Craig and Antonelli

[57] ABSTRACT
A semiconductor switching circuit comprising a semiconductor element having an equivalent four-layer structure of a PNPN conductivity type formed by connecting the collector and the base of an NPN transistor respectively with the base and the collector of a PNP transistor and having a function of self-holding alternately two states, i.e. its on state and off state, a gate-turnoff thyristor, and a gate control circuit which provides to the gate of the gate-turnoff thyristor a current for turning on the gate-turnoff thyristor when the semiconductor element is conductive, and a current for turning off the gate-turnoff thyristor when the semiconductor element is cut off, whereby electrical switching is achieved by turning on and off the gate-turnoff thyristor in accordance with the state of the semiconductor element. The semiconductor switching circuit is useful as a cutoff switch used in a telephone exchange equipment since it consumes very small power because the semiconductor element is cut off when the gate-turnoff thyristor is conductive and since it has a large current capacity when the gate-turnoff thyristor is conductive.

11 Claims, 7 Drawing Figures

SEMICONDUCTOR SWITCHING CIRCUIT

LIST OF PRIOR ART REFERENCES (37 CFR 1.56 (a))

The following references are cited to show the state of the art:

Japanese Patent Application Laid Open No. 8223/72, Apr. 28, 1972, Claiming Convention Priority of British Patent Application No. 47,430 filed on Oct. 6, 1970

Japanese Patent Application Laid Open No. 8224/72, Apr. 28, 1972, Claiming Convention Priority of British Patent Application No. 47,432 filed on Oct. 6, 1970

This invention relates to a semiconductor switching circuit and more particularly to a switching circuit such as a cutoff switch used in a telephone exchange equipment, which is required to consume very small power in one of the switching states.

Telephone exchange equipment has subscribers' circuits each of which is provided on a subscriber's terminal to detect the subscriber's calling. The subscriber's circuit is connected with a talking line when the talking line is not occupied, and ready for detecting the subscriber's calling signal. After the detection of the subscriber's calling signal or at the time when the subscriber is called by another subscriber, however, the subscriber's circuit must be disconnected from the subscriber's talking line so as not to adversely affect the talking line. It is a cutoff switch that serves to disconnect the subscriber's circuit from the talking line. In the prior art, the cutoff switch is mechanically constituted, using a part of a crossbar switch.

With the recent development of semiconductor IC techniques, attempts have been made to develop semiconductor channel switches to use in telephone exchange equipment and these attempts have also led to the demand for developing a semiconductor cutoff switch. One example of such a semiconductor cutoff switch would be a transistor used as a switching element and a flip-flop circuit provided to latch a signal for determining the conduction and cutoff of the switching element, whereby the output of the flip-flop circuit may control the gate of the transistor. Through the conduction and cutoff of the transistor, the talking line is connected with and disconnected from the subscriber's circuit.

This kind of semiconductor cutoff switch, however, is not suitable for the purpose in question. The reason is that several severe conditions are imposed on the switch. For example, since every subscriber is provided with a cutoff switch and thus a great number of such switches are used, its power consumption must be very small. When the switch is on, a current sufficient for detecting a calling signal must flow therethrough and it must have a low resistance. Further, it must have a high withstand voltage in two directions. With the switch described above, however, one of the transistors constituting the flip-flop circuit is conductive independent of whether the switch is conductive or cut off and the conducting transistor draws a current. Thus, the circuit has the serious drawback that the switch always consumes power. Moreover, the transistor used as the switching element is not suitable as a path for a large current.

One object of this invention is to provide a switching circuit used as the above-mentioned cutoff switch, which is suitable for fabrication in a semiconductor constitution.

Another object of this invention is to provide a switching circuit which consumes small power and has a large current capacity.

In order to attain the above objects, the semiconductor switching circuit according to this invention comprises a gate-turnoff thyristor used as a switching element, and a semiconductor element having an equivalent four-layer structure of a PNPN conductivity type, used as a holding circuit the on and off states of which are alternately held. A gate control circuit controls the thyristor in its conduction and cutoff by supplying one of currents having opposite directions to the gate of the thyristor in accordance with the state of the holding circuit.

According to this invention, therefore, there is provided a semiconductor switching circuit comprising a gate-turnoff thyristor having an anode terminal, a cathode terminal and a gate terminal, the anode-cathode path of which is turned on or off in accordance with the direction of a current flowing through the gate terminal; a holding circuit including therein a semiconductor element having an equivalent four-layer structure of a PNPN conductivity type and having an input terminal and an output terminal, which element has a self-holding function for holding alternately its conductive and cutoff states to store binary information and which determines the state to be held in accordance with an input signal applied to the input terminal to indicate the state to be held; and a gate control circuit which controls the direction of the current flowing through the gate terminal of the gate-turnoff thyristor, thereby turning on or off the gate-turnoff thyristor in accordance with the state of the holding circuit.

Figure 1:
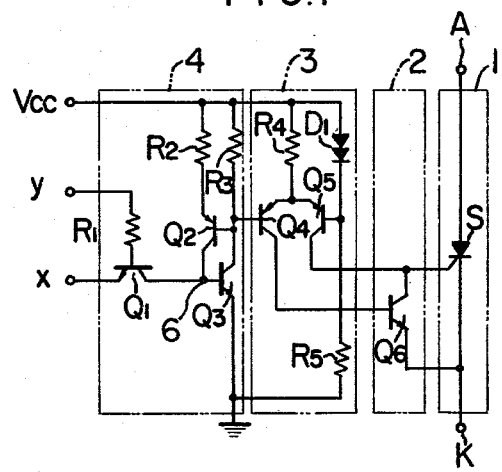
FIG. 1 shows a semiconductor switching circuit as one embodiment of this invention.

FIG. 1 shows a semiconductor switching circuit according to an embodiment of this invention, in which reference numeral 1 designates a cutoff circuit having a gate-turnoff thyristor S (hereafter referred to as a PNPN switch S); 2 a gate switching circuit having a transistor $Q_6$ for causing the PNPN switch S to perform its gate-turnoff action; 3 a constant current switching circuit having transistors $Q_4$ and $Q_5$, a diode $D_1$ and resistors $R_4$ and $R_5$; and 4 a holding circuit including a holding section comprising a semiconductor element having an equivalent four-layer structure of a PNPN conductivity type composed of transistors $Q_2$ and $Q_3$ and resistors $R_2$ and $R_3$, and a logic input section comprising a transistor $Q_1$ and a resistor $R_1$. The cutoff circuit 1 has an anode terminal A and a cathode terminal K which are at ground potential and a negative potential, respectively. The cutoff circuit, with its anode terminal, is connected with a talking line (not shown) and, its cathode terminal, connected with a circuit (not shown) for detecting a calling signal. The talking line and the calling signal detecting circuit are in a connected state when the PNPN switch S is on, while they are in a cut-off state when the PNPN switch S is off. The gate switching circuit 2 and the constant current switching circuit 3 constitute a gate control circuit for controlling the direction of a current flowing through the gate of the PNPN switch S in accordance with the state of the holding circuit 4. The semiconductor element having an equivalent four-layer structure of PNPN constructed by connecting the base and the collector of the PNP transistor $Q_2$ respectively with the collector and the base of the transistor $Q_3$, has a self-holding function and is used as a memory circuit. The element assumes one state where the transistors $Q_2$ and $Q_3$ are both cut off and the other state where the transistors $Q_2$ and $Q_3$ are both saturated. Binary information can be stored depending on the two states. The changeover of the states is achieved in accordance with the direction of a current at the P type gate 6. In FIG. 1, the collector of the NPN transistor $Q_1$ of the logic input section is connected with the P type gate 6 to provide this current. The base and the emitter of the transistor $Q_1$ are connected respectively with input terminals y and x. The input terminal y receives a trigger signal for rewriting the holding state (for inversion from one state to the other) and the input terminal x receives a signal for indicating the state to be held (one of the two states). In case of using the semiconductor switching circuit as the above-mentioned cutoff switch, the input terminal x receives "0" (low level signal) when the associated subscriber's circuit is in the state of waiting for a calling signal and "1" (high level signal) after the subscriber's circuit has detected a calling signal or when the subscriber is called. When no trigger signal is applied to the input terminal y, the transistor $Q_1$ remains inactive so that the state of the holding circuit is held unaltered independent of the signal level at the input terminal x. When the input terminal y receives a trigger signal while the input terminal x receives "0," a current flows through the transistor $Q_1$ from the P type gate 6 toward the input terminal x so that the PNPN holding section is turned off. When the input terminal x receives "1" while the input terminal y receives a trigger signal, a current flows from the terminal x toward the P type gate 6 so that the PNPN holding section is turned on.

Namely, when the input terminal y receives a trigger signal, the holding section is set on if the input terminal x receives "1" and set off if the terminal x receives "0".

When the holding section is cut off, the transistors $Q_4$, $Q_5$ and $Q_6$ are respectively off, on and off so that a constant current flowing through the transistor $Q_5$ drives the gate of the PNPN switch S to turn on the PNPN switch S. In this state, the transistors $Q_1$, $Q_2$ and $Q_3$ are all cut off so that no power is consumed by them.

When the holding section is turned on, the transistor $Q_4$ is turned on so that a constant current flows through the transistor $Q_4$ to turn on the transistor $Q_6$. Accordingly, a reverse current flows through the gate of the PNPN switch S to turn off the PNPN switch S so that the path between the anode and the cathode of the PNPN switch S is opened. In this case, the transistors $Q_2$ and $Q_3$ are conductive and thus power is consumed. However, this is only when the talking line is occupied and the time of the occupation is very much shorter than the time of waiting for a calling signal.

In order to decrease the power consumption, the constant current flowing through the transistor $Q_5$ to drive the gate of the PNPN switch S should preferably be set near the minimum value for which the gate can be driven and the constant current flowing through the transistor $Q_4$ to drive the transistor $Q_6$ should preferably be set near the minimum value for which the transistor $Q_6$ can cause a flow of a current to turn off the PNPN switch S. If this is realized, the current flowing through the transistor $Q_5$ when the holding section is cut off is very small and the current flowing through the transistors $Q_4$ and $Q_6$ is almost negligible, since the period for which the holding section is conductive is short, as described above.

As also described above, the switching circuit according to this invention consumes very small power in one of the two switching states and thus in general can be operated at low power consumption. Moreover, with this switching circuit, since the switching element have a PNPN structure is used in the cutoff circuit, a large current can be treated while a high withstand voltage and a low on-resistance can be obtained.

Further, this switching circuit, which is constituted of transistors, diodes and resistors, can be easily fabricated in a semiconductor IC configuration.

Figure 2:
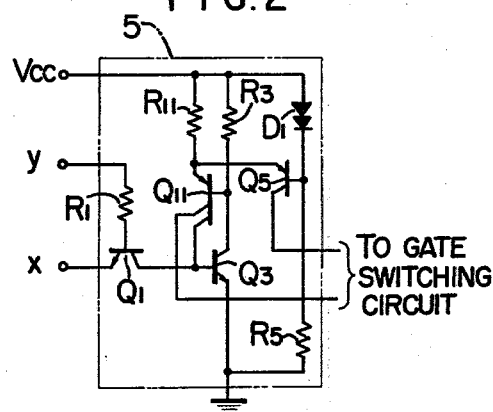
FIG. 2 shows an example of a combination of a holding circuit and a constant current switching circuit used in a semiconductor switching circuit according to this invention.

FIG. 2 shows a variation of the holding circuit 4 and the constant current switching circuit 3 and the same reference numerals and characters indicate equivalent elements or parts in FIG. 1. In this embodiment shown in FIG. 2, a multi-collector transistor $Q_{11}$ is substituted for the combination of the transistor $Q_2$ of the holding circuit 4 and the transistor $Q_4$ of the constant current switching circuit 3. The multi-collector transistor is easily obtained through semiconductor IC techniques by forming an additional P-type region in the N gate region of a lateral type PNPN switch. The operation of this circuit 5 is the same as that of the circuit shown in FIG. 1.

Through the integration of a part of the holding circuit 4 and a part of the constant current switching circuit 3, the occupying area in a semiconductor IC can be decreased and this leads to the reduction of cost.

Figure 3:
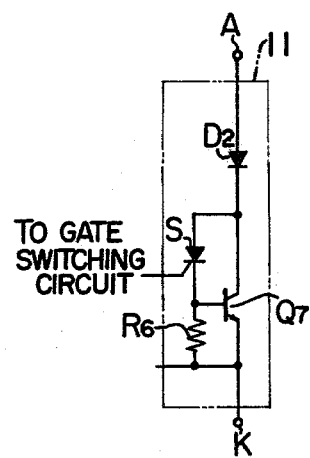
FIG. 3 shows an example of a cutoff circuit used in a semiconductor switching circuit according to this invention.

FIG. 3 shows another example of the cutoff circuit 1, in which a current bypass is provided for the PNPN switch S. The cutoff circuit 11 is of gate-turnoff thyristor type formed of a combination of a PNPN switch S and a transistor $Q_7$. Since most part of the current flowing between the anode terminal A and the cathode terminal K of the cutoff circuit 11 passes through the transistor $Q_7$ while only a fractional current flows through the PNPN switch S, the gate-turnoff action by the transistor $Q_6$ of the gate switching circuit 2 connected with the gate of the PNPN switch S takes place easily. Thus, this circuit configuration eliminates a drawback that the gate-turnoff action of a PNPN switch of a lateral type used in a semiconductor IC is hard to take place due to the internal resistance of the P gate layer of the switch. A resistor $R_6$ is used to increase the withstand voltage between the collector and the emitter of the transistor $Q_7$ and a diode $D_2$ is inserted to provide a desirable reverse withstand voltage.

Figure 4:
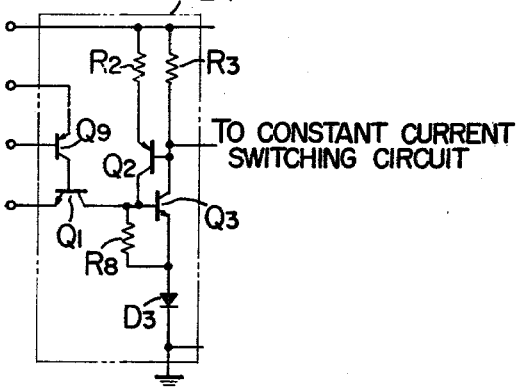
FIG. 4 shows an example of a logic input section of a holding circuit used in a semiconductor switching circuit according to this invention.

FIG. 4 shows another example of the holding circuit, which is constituted by adding a PNP transistor $Q_9$, a resistor $R_8$ and a diode $D_3$ to the holding circuit 4 shown in FIG. 1. The transistor $Q_9$ has its collector connected with the base of the transistor $Q_1$, as shown, so as to control the gate of the transistor $Q_1$. The emitter and the base of the transistor $Q_9$ are connected respectively with the input terminals y and z. With this circuit configuration, the transistor $Q_1$ is gated by a logical product of input signals at the terminals y and z whereas in the circuit shown in FIG. 1 the transistor $Q_1$ is gated by the signal at the terminal y alone. Namely, only when the signals at the terminals y and z are both at high level (logic "1"), the signal applied to the terminal x is valid. The diode $D_3$ is a level shift diode for increasing the noise margin of the holding circuit. The resistor $R_8$ serves to prevent the holding section having the transistors $Q_2$ and $Q_3$ from erroneously operating due to the rate effect. Further, in order to prevent the holding circuit 24 having a holding section consisting of the transistors $Q_2$ and $Q_3$ in PNPN configuration or the gate-turnoff thyristor circuit 1 from erroneously operating due to the rate effect and in order to drive the gates with high sensitivity, a protective circuit of a variable impedance may be provided between the gate and the cathode of each circuit.

Figure 5:
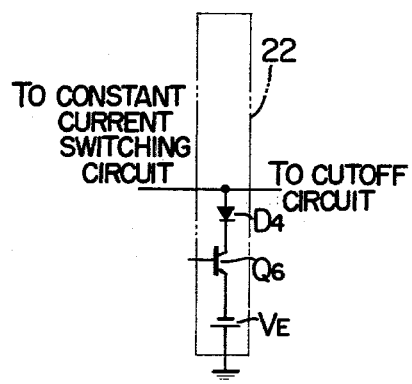
FIG. 5 shows an example of a gate switching circuit in a semiconductor switching circuit according to this invention.

FIG. 5 shows another example of the gate switching circuit. In the circuit 2 shown in FIG. 1, the emitter of the transistor $Q_6$ is connected with the cathode of the PNPN switch S, i.e. the cathode terminal K of the cutoff switch 1, and when the PNPN switch S is cut off, there is a current flowing through the transistors $Q_4$ and $Q_6$ to the cathode terminal K. Therefore, in the case where a talking line is connected with the cathode terminal K, this current may adversely affect the talking line. The circuit 22 shown in FIG. 5 can prevent such an adverse affect by its specific constitution wherein the emitter of the transistor $Q_6$ is connected with a negative power source $V_E$ and disconnected from the cathode terminal K of the cutoff circuit 1, and thus there is no current flowing into the cathode terminal K. A diode $D_4$ is inserted to prevent a reverse current flow that may take place, when the potential at the cathode of the PNPN switch S falls, due to the emitter of the transistor $Q_6$ being connected with the power source $V_E$. The operation of the remaining part of the circuit 22 is the same as that of the circuit 2 shown in FIG. 1.

Figure 6:
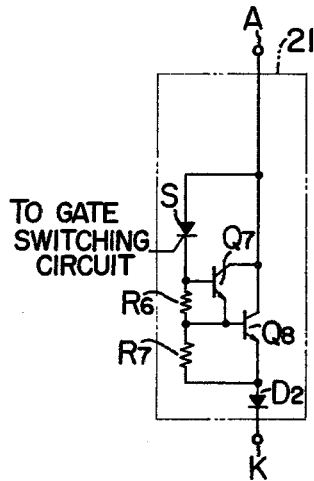
FIG. 6 shows another example of a cutoff circuit in a semiconductor switching circuit according to this invention.

FIG. 6 shows another example of the cutoff circuit. This example is a modification of the cutoff switch 11 with the shunting path, shown in FIG. 3. As shown in FIG. 6, a transistor $Q_8$ is additionally provided to form a Darlington circuit together with the transistor $Q_7$. With this circuit configuration, that part of the current flowing between the anode and cathode terminals A and K which flows through the PNPN switch S is further reduced due to the Darlington connection and therefore the gate-turnoff action is more facilitated. The resistor $R_6$ and a resistor $R_7$ serve to increase the collector-emitter withstand voltages of the transistors $Q_7$ and $Q_8$ and to form discharging paths for the electric charges accumulated in the bases of the transistors. The diode $D_2$ serves to compensate for the decrease in the reverse withstand voltage due to the provision of the transistors $Q_7$ and $Q_8$. This circuit 21 is adapted to have its anode terminal A grounded and its cathode terminal K connected with the talking line.

According to the above-described embodiments of this invention, the gate-turnoff thyristor is cut off and turned on respectively when the holding circuit is rendered on and off. Thus in the case where the time for which the gate-turnoff thyristor is conductive predominates, such as in a case of a subscriber's circuit of a telephone exchange equipment detecting a calling signal, the conductive state is maintained by turning off the holding circuit to reduce to zero the power consumption during the conductive state so that the total power consumed can be decreased.

Alternatively, however, the switching circuit may be so constructed that the gate-turnoff thyristor is conductive when the holding circuit is conductive.

Figure 7:
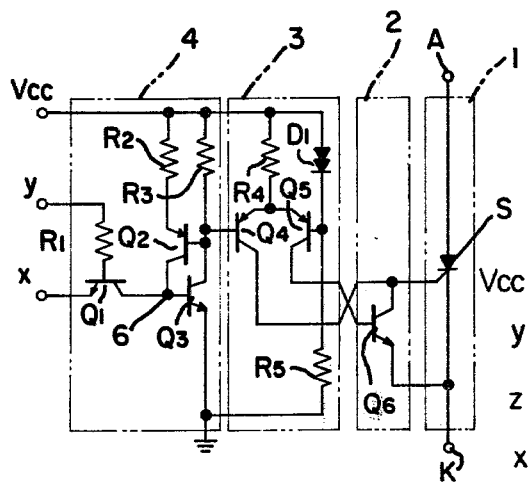
FIG. 7 shows an alternate embodiment for the semiconductor switching circuit of the present invention.

This could be readily accomplished, as shown in FIG. 7, by coupling the collector of $Q_5$ to the base of $Q_6$ and the collector of $Q_4$ to the gate of the thyristor S rather than the reverse connection heretofore discussed in conjunction with FIG. 1. The embodiment shown in FIG. 7 is identical to that of FIG. 1 except for this coupling arrangement of $Q_4$, $Q_5$ and $Q_6$. Namely, even in the case where the time for which the holding circuit is conductive is longer than the time for which the holding circuit is cut off, the holding circuit operates also in the period for which no power consumption is needed for holding action, and consumes much smaller power in comparison with a flip-flop circuit used in the prior art switching circuit. This is because the flip-flop circuit consumes power to maintain either of the conductive and cutoff states of a gate-turnoff thyristor.

This invention can also be embodied by the combinations of the variations described above or other possible variations, falling within the scope of this invention.

I claim:

1. A semiconductor switching circuit comprising:
   a gate-turnoff thyristor having an anode terminal, a cathode terminal and a gate terminal, the anode-cathode path of which is turned on or off in accordance with the direction of the current flowing through said gate terminal;
   a holding circuit including therein a semiconductor element having an equivalent four-layer structure of a PNPN conductivity type and having an input terminal and an output terminal, which element has a self-holding function for holding alternately its conductive and non-conductive states to store binary information and which determines the state to be held in accordance with an input signal applied to said input terminal to indicate the state to be held; and
   a gate control circuit coupled between the output terminal of the holding circuit and the gate terminal of the gate-turnoff thyristor to control the direction of the current flowing through the gate terminal of said gate-turnoff thyristor,
   wherein the gate control circuit includes a gate switching circuit having two terminals and a constant current switching circuit having an input terminal and two output terminals, said input terminal of the constant current switching circuit being connected to said output terminal of said holding circuit, one of said output terminals of the constant current switching circuit being connected to said gate terminal of said gate-turnoff thyristor, the other one of said output terminals of said constant current switching circuit being connected to one of said two terminals of said gate switching circuit, the other one of said two terminals of said gate switching circuit being connected to said gate terminal of said gate-turnoff thyristor, thereby turning on or off said gate-turnoff thyristor in accordance with the state of the holding circuit.

2. A semiconductor switching circuit as claimed in claim 1, wherein said gate-turnoff thyristor is turned on by causing a current to flow into said gate of said gate-turnoff thyristor when said semiconductor element is cut off while said gate-turnoff thyristor is turned off by causing a current to flow out of said gate of said gate-turnoff thyristor when said semiconductor element is conductive.

3. A semiconductor switching circuit as claimed in claim 1, wherein said gate-turnoff thyristor is turned on by causing a current to flow into said gate of said gate-turnoff thyristor when said semiconductor element is conductive while said gate-turnoff thyristor is turned off by causing a current to flow out of said gate of said gate-turnoff thyristor when said semiconductor element is cut off.

4. A semiconductor switching circuit as claimed in claim 1, wherein said holding circuit further comprises a transistor for logic inputs, which transistor has a collector connected with the input terminal of said semiconductor element, an emitter for receiving a signal for specifying any one of the states of the holding circuit and a base for receiving a trigger signal.

5. A semiconductor switching circuit as claimed in claim 1, wherein said holding circuit comprises a first transistor and a second transistor for logic inputs, each of which has a collector, an emitter and a base, the collector of said first transistor being connected with the input terminal of said semiconductor element, the collector of said second transistor being connected with the base of said first transistor, said base and emitter of said second transistor receiving independent trigger signals, said first transistor being triggered when said trigger signals are simultaneously applied, and said emitter of said first transistor receiving a signal for specifying any one of the states of said holding circuit.

6. A semiconductor switching circuit as claimed in claim 1, wherein said gate-turnoff thyristor provided with a transistor for current bypassing, which transistor has a collector connected with the anode terminal of said gate-turnoff thyristor, a base connected with the cathode terminal of said gate-turnoff thyristor, and an emitter connected through a resistor with said base.

7. A semiconductor switching circuit as claimed in claim 1, wherein said gate control circuit further comprises first and second transistors in the constant current switching circuit one of which is turned on when said holding circuit is turned on and the other of which is turned on when said holding circuit is turned off, and a third transistor in the gate switching circuit having a collector, an emitter and a base, said collector being connected with the gate of said gate-turnoff thyristor and said emitter being supplied with a potential having the same polarity as a polarity at said cathode terminal of said gate-turnoff thyristor, and wherein a current flowing through said first transistor is supplied to said gate of said gate-turnoff thyristor while a current flowing through said second transistor is supplied to said base of said third transistor.

8. A semiconductor switching circuit as claimed in claim 7, wherein said emitter of said third transistor is connected with the cathode terminal of said gate-turnoff thyristor.

9. A semiconductor switching circuit as claimed in claim 7, wherein said emitter of said third transistor is separated from the cathode terminal of said gate-turnoff thyristor and a potential having the same polarity as a polarity at said cathode terminal of said gate-turnoff thyristor is applied to said emitter.

10. A semiconductor switching circuit as claimed in claim 7, wherein said holding circuit comprises a first transistor of a PNP type and a second transistor of an NPN type, each transistor having a collector, an emitter and a base; the base of said first transistor is connected with the collector of said second transistor and the base of said second transistor is connected with the collector of said first transistor; and said base and collector of said second transistor are used respectively as an input and an output terminals.

11. A semiconductor switching circuit as claimed in claim 10, wherein said first transistor of said holding circuit and said second transistor of said gate control circuit are unified into one element by employing a multi-collector constitution with common base and emitter.

* * * * *